(12) United States Patent
Schultz

(10) Patent No.: US 7,631,209 B2
(45) Date of Patent: Dec. 8, 2009

(54) TURNING OFF CLOCK TO FLIP FLOPS

(75) Inventor: Richard Thomas Schultz, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 693 days.

(21) Appl. No.: 11/010,463

(22) Filed: Dec. 13, 2004

(65) Prior Publication Data

US 2006/0129859 A1      Jun. 15, 2006

(51) Int. Cl.
| | |
|---|---|
| G06F 1/00 | (2006.01) |
| G06F 1/32 | (2006.01) |
| G06F 7/38 | (2006.01) |
| H03B 21/00 | (2006.01) |
| H03K 5/01 | (2006.01) |

(52) U.S. Cl. .................. 713/322; 713/320; 326/46; 327/107; 327/166

(58) Field of Classification Search ................ 713/322, 713/320; 326/46; 327/107, 166
See application file for complete search history.

(56) References Cited

U.S. PATENT DOCUMENTS

| 5,498,988 | A  | * | 3/1996 | Reyes et al. ................. 327/199 |
| 6,204,707 | B1 | * | 3/2001 | Hamada et al. ............. 327/202 |
| 6,630,853 | B1 | * | 10/2003 | Hamada ..................... 327/202 |
| 6,828,837 | B2 | * | 12/2004 | Ahn .......................... 327/202 |

* cited by examiner

*Primary Examiner*—Thomas Lee
*Assistant Examiner*—Stefan Stoynov

(57) ABSTRACT

Exemplary techniques for turning off the clock signal to flip flops are described, which may reduce power consumption by electronic devices. In an implementation, a clock-gating logic turns off the clock signal to a flip flop when a data input of the flip flop remains untoggled. The reduction in power consumption is envisioned to also reduce heat generation.

15 Claims, 6 Drawing Sheets

TURNING OFF CLOCK TO FLIP FLOPS

TECHNICAL FIELD

The present description generally relates to electronic devices. More particularly, an implementation relates to turning off the clock signal to flip flops, e.g., to reduce power consumption in the flip flops.

BACKGROUND

As integrated circuit (IC) technology improves, manufacturers are able to integrate additional functionality onto a single chip. The additional functionality, in turn, introduces additional power consumption. The increased power consumption may be addressed by supplying better sources of power which may be more expensive and bulkier.

The additional power consumption also results in more heat generation. The increased heat generation can limit the use of the electronic device and contribute to functional or physical breakdowns.

One current approach cools the IC by utilizing heat sinks and fans Another approach utilizes liquid cooling, which can be relatively expensive. As the generated heat increases, however, so do the costs and adequateness of these cooling approaches.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Exemplary techniques for turning off the clock signal to flip flops are described, which may reduce power consumption by electronic devices. In an implementation, a clock-gating logic turns off the clock signal to a flip flop when a data input of the flip flop remains untoggled. The reduction in power consumption is envisioned to also reduce heat generation.

In one implementation, the power consumption of a flip flop is reduced by turning off the clock to at least a portion of the flip flop when the flip flop input signal remains unchanged. In another implementation, during a synthesis process of an IC, one or more flip flops present in the design are selected to be self clock-gated. For example, flip flops that have a relatively low toggle rate are replaced with power smart flip flops (or selected to include additional self clock-gating circuitry) as will be further discussed herein.

Power Smart Flip Flop Architecture

Figure 1:
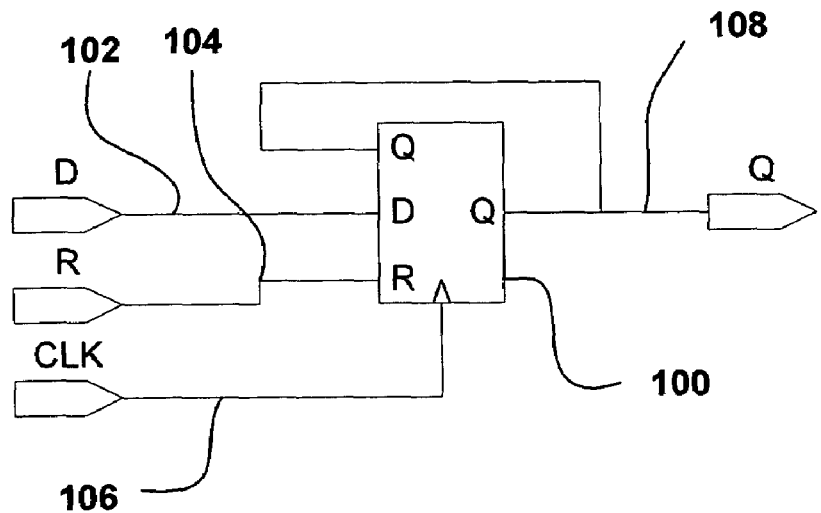
FIG. 1 illustrates an exemplary power smart flip flop, according to an implementation.

FIG. 1 illustrates an exemplary power smart flip flop 100, according to an implementation. The flip flop 100 receives as input a data signal 102 (e.g., a data value that the flip flop is to store), a reset signal 104 (e.g., to reset the flip flop 100), and a clock signal 106. The flip flop 100 also receives its own output 108 as input. The flip flop 100 may also include a second output that is a complementary to the output 108 (e.g., $\overline{Q}$). Moreover, the output 108 may be provided to the flip flop 100 internally, e.g., not as an input. Hence, the flip flop 100 has the data signal 102 and the reset signal 104 as inputs in one implementation.

The flip flop 100 is envisioned to shut down the clock signal 106 to at least a portion of the flip flop 100 when the data signal 102 remains untoggled (e.g., by comparing the data signal 102 and the output 108). This implementation is envisioned to reduce power consumption in the flip flop 100 and/or reduce heat generation by the flip flop 100.

Figure 2:
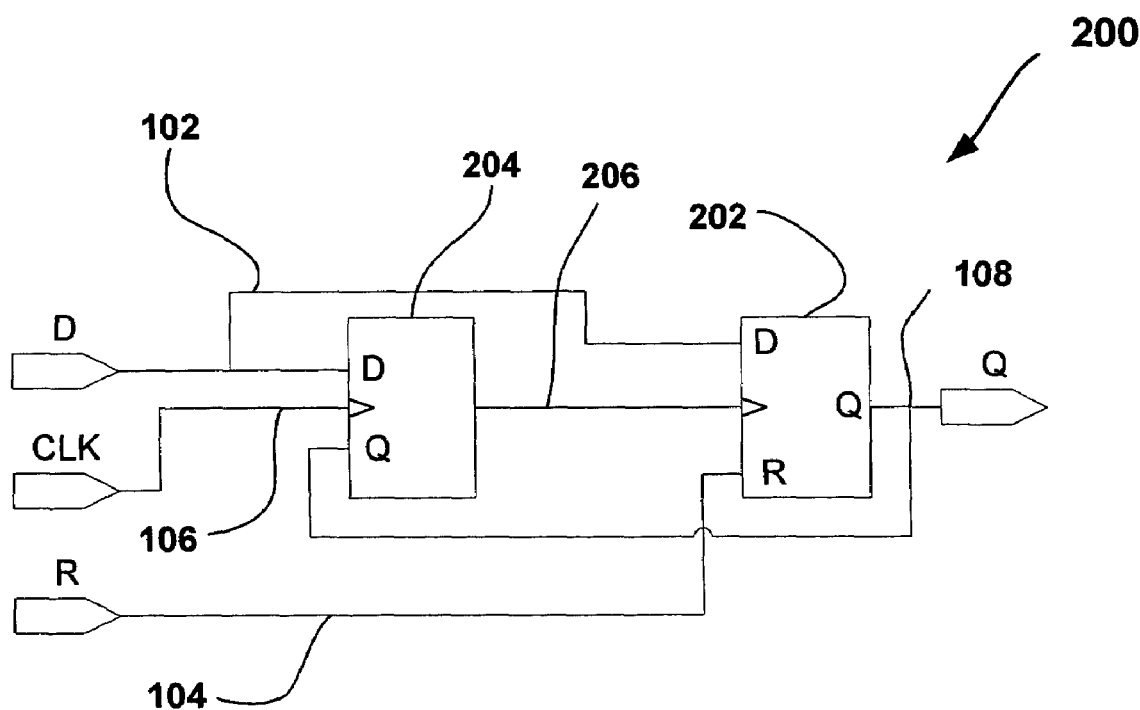
FIG. 2 illustrates an exemplary power smart flip flop architecture which utilizes a flip flop, according to an implementation.

FIG. 2 illustrates an exemplary power smart flip flop architecture 200 which utilizes a flip flop 202. In one implementation, the power smart flip flop architecture 200 may be utilized as the power smart flip flop 100 of FIG. 1. As illustrated in FIG. 2, the flip flop 202 receives the data signal 102 and the reset signal 104. The flip flop 202 may be any suitable flip flop such as an RS, JK, latch, or D flip flop.

The smart flip flop architecture 200 also includes a clock-gating logic 204 that provides a clock signal 206 to the flip flop 202. The clock-gating logic 204 receives the data signal 102, an output of the flip flop 202 (108), and a clock signal (106). The clock-gating logic 204 is envisioned to provide the clock signal 106 (as signal 206) to the flip flop 202 when the data signal 102 remains untoggled (e.g., by comparing the data signal 102 and the output 108). Accordingly, the clock-gating logic 204 shuts down the clock to at least the flip flop 202 to save power when the data signal 102 remains untoggled. Additionally, in one implementation, the clock-gating logic 204 is implemented as part of the flip flop design, e.g., to limit space and/or improve routing closer to the flip flop.

Process of Reducing Power Consumption in Power Smart Flip Flop

Figure 3:
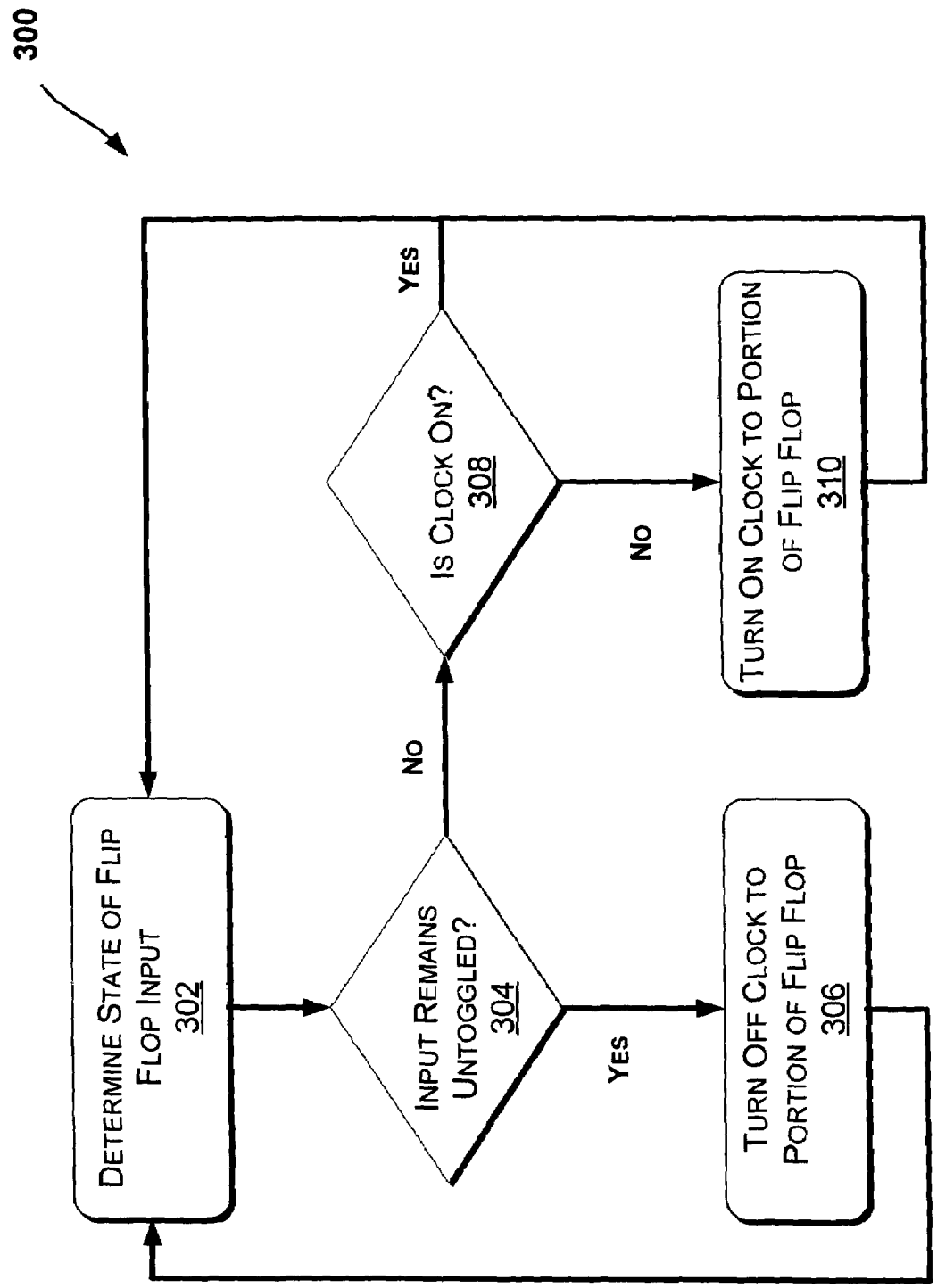
FIG. 3 illustrates an exemplary method of reducing power consumption in a flip flop, according to an implementation.

FIG. 3 illustrates an exemplary method 300 of reducing power consumption in a flip flop. The method 300 determines a state of the input to a flip flop (302) such as those discussed with reference to FIGS. 1 and 2, e.g., by determining when a data input of the flip flop remains untoggled (304). If the input remains untoggled, the clock to at least a portion of the flip flop (e.g., clock signal 206 of FIG. 2) is turned off (306) and the method 300 returns to the stage 302.

On the other hand, if it is determined that the data input is toggled (304), it is further determined whether the clock signal for the portion of the flip flop (e.g., 206 of FIG. 2) is on (308). If the clock signal is off, the clock signal is turned on (310) and the method 300 continues with the stage 302. Otherwise, if the clock signal is on, the method 300 continues with the stage 302.

In one implementation, the determination of the stages 304 and/or 308 is performed by comparing the data input with the output of the flip flop (e.g., signals 102 and 108 discussed with reference to FIGS. 1 and 2). The turning off of the clock signal is envisioned to reduce power consumption in the flip flop and/or heat generation by the flip flop.

Exemplary Power Consumption Graphs

Figure 4:
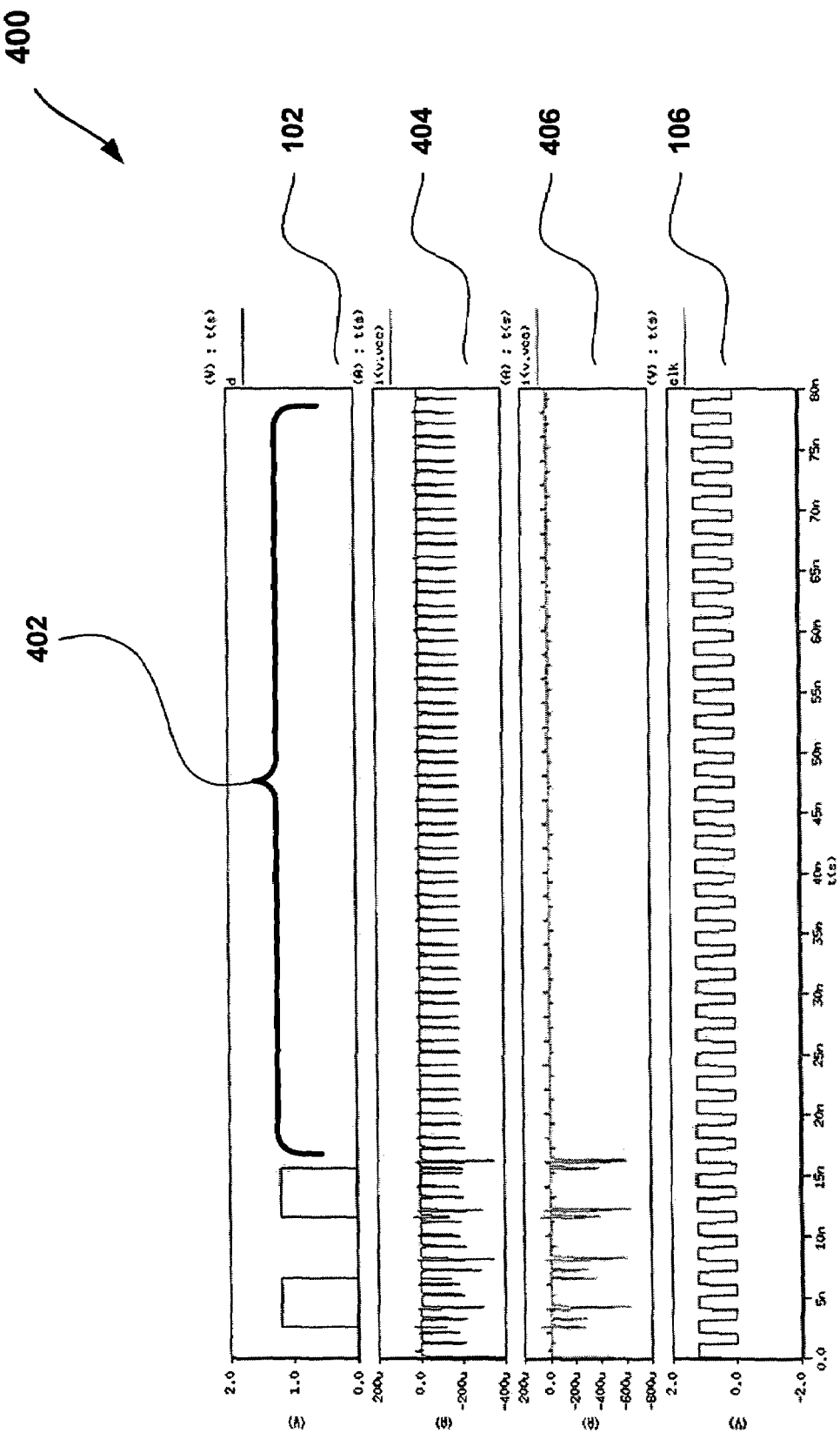
FIG. 4 illustrates an exemplary signal graph corresponding to the power consumption of the power smart flip flops of FIGS. 1 and 2, according to an implementation.

FIG. 4 illustrates an exemplary signal graph 400 corresponding to the power consumption of the power smart flip flops of FIGS. 1 and 2. Once the data signal 102 remains untoggled during clock signals 106 (402), an ordinary flip flop will continue its power burn (404), whereas a power smart flip flop (such as those discussed with reference to FIGS. 1-3) stops its power burn (406).

Figure 5:
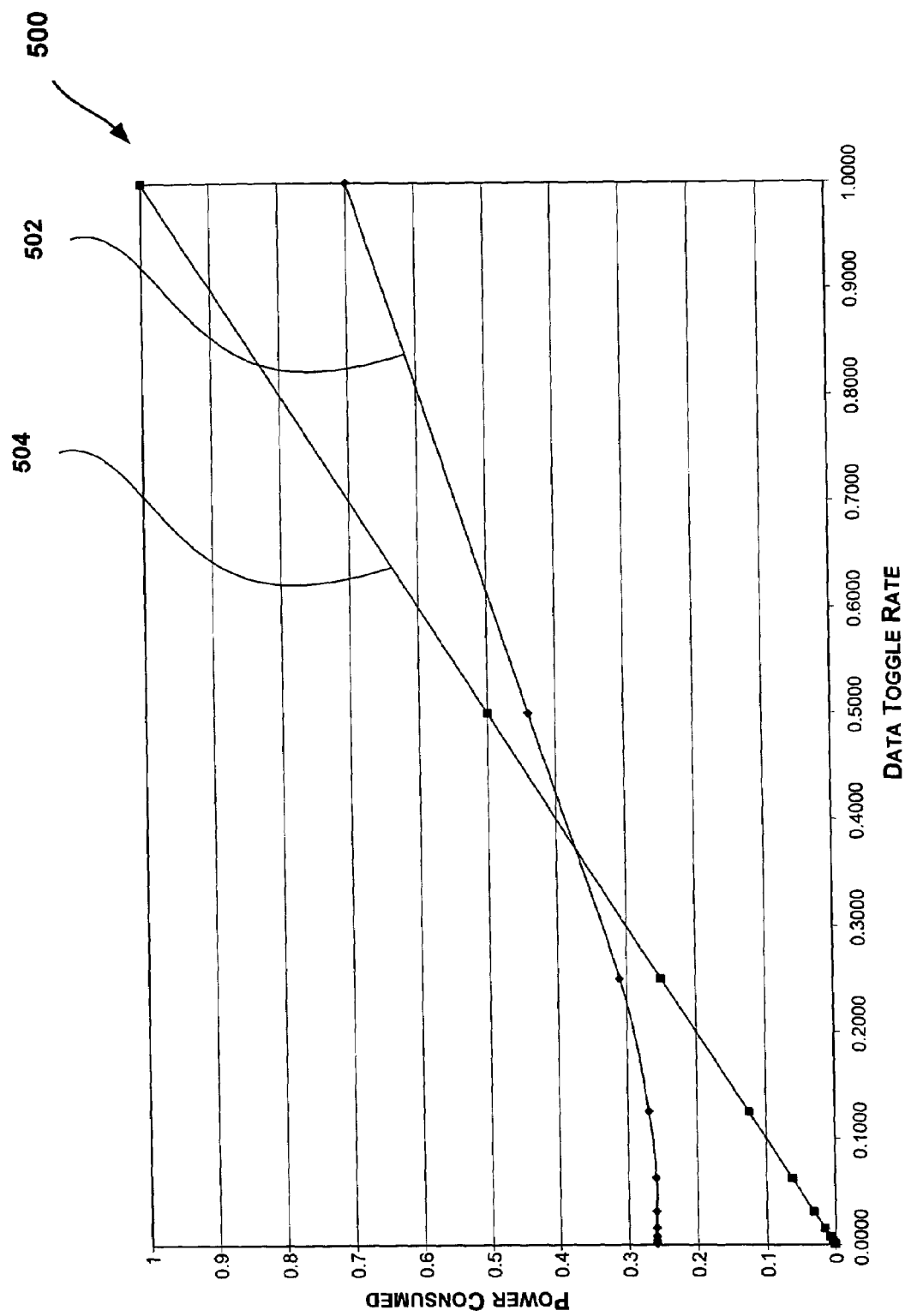
FIG. 5 illustrates an exemplary normalized power consumption versus data toggle rate graph corresponding to the power consumption of the power smart flip flops of FIGS. 1 and 2, according to an implementation.

FIG. 5 illustrates an exemplary normalized power consumption versus data toggle rate graph 500 corresponding to the power consumption of the power smart flip flops of FIGS. 1 and 2. As illustrated, below a certain threshold data toggle rate, an ordinary flip flop (502) consumes significantly more power than a power smart flip flop (504) such as those discussed with reference to FIGS. 1-3.

The threshold toggle rate may be different for differing process technologies, applications, IC types, and the like. In one implementation (such as the one illustrated in FIG. 5), the threshold toggle rate can be at about 25 to 50 percent. Accordingly, if select flip flops that have a relatively low toggle rate are replaced with power smart flip flops (or selected to include additional self clock-gating circuitry such as discussed with reference to FIG. 2, overall power consumption of an IC may be reduced as will be further discussed with reference to FIG. 7.

Exemplary Clock-Gating Logic in Power Smart Flip Flop

Figure 6:
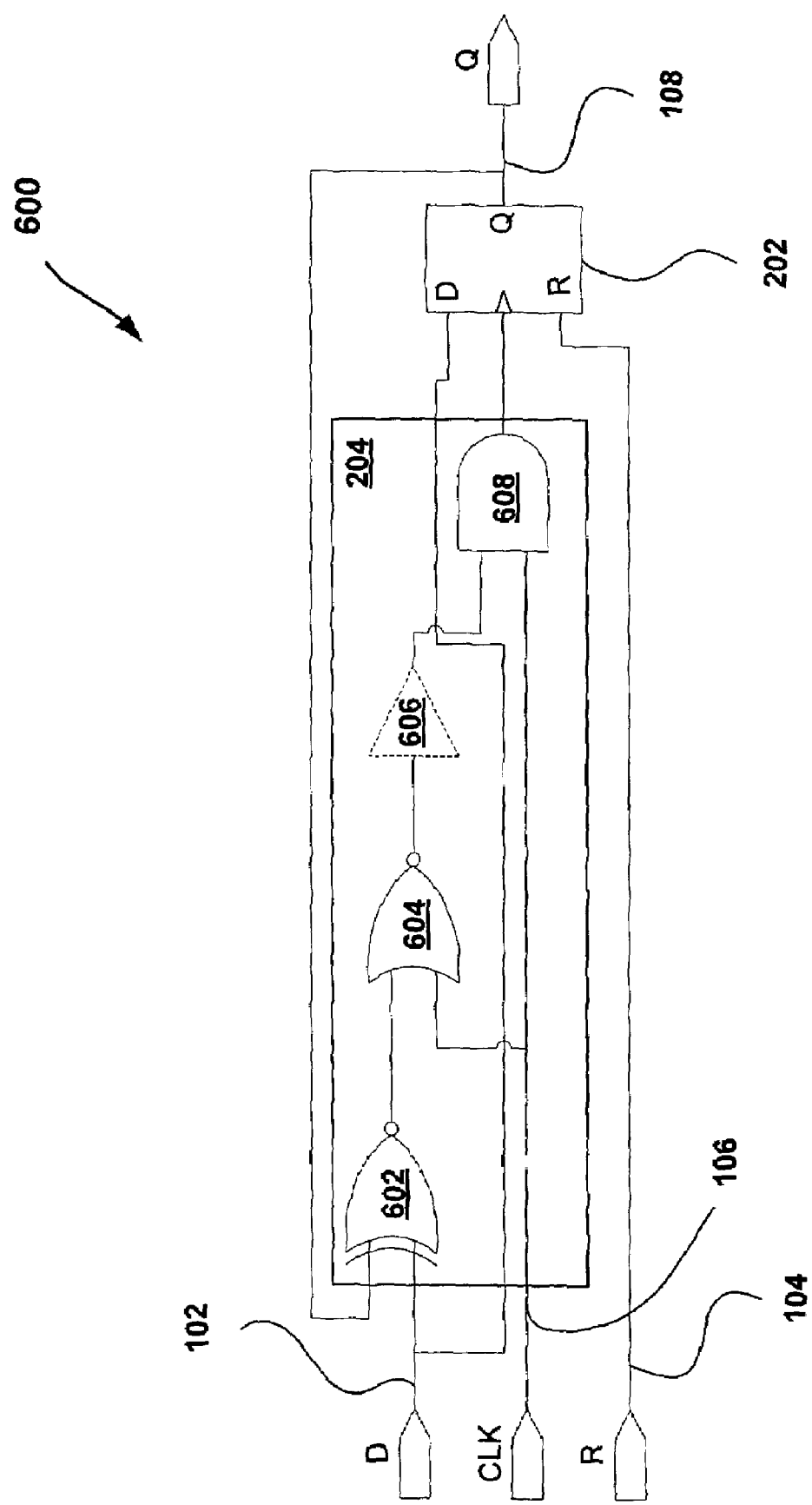
FIG. 6 illustrates an exemplary power smart flip flop architecture, according to an implementation.

FIG. 6 illustrates an exemplary power smart flip flop architecture 600. In one implementation, the flip flop architecture 600 may be utilized as the power smart flip flops 100 and 200 of FIGS. 1 and 2, respectively. The flip flop architecture 600 includes the input data signal 102, clock signal 106, reset signal 104, flip flop 202, output signal 108, and the clock-gating logic 204.

As illustrated in FIG. 6, the clock-gating logic 204 includes an exclusive NOR gate (602) which receives as its input the data signal 102 and the output signal 108, and provides its output to a NOR gate (604). The NOR gate 604 also receives the clock signal 106 as input. The clock-gating logic 204 may optionally include a buffer 606, for example, to buffer and/or delay the output of the NOR gate 604 prior to providing it to an AND gate 608. The delay associated with the buffer 606 and/or the NOR gate 604 is envisioned to ensure that the clock-gating logic 204 allows the clock signal 106 to pass through to the flip flop 202 when the data signal toggles (see, e.g., the discussion of stages 308 and 310 of FIG. 3). The AND gate 608 also receives the clock signal 106 as input, e.g., to provide the clock-gated clock signal 206 of FIG. 2.

Accordingly, as long as the data signal 102 remains untoggled (e.g., as compared with the output signal 108 at the exclusive NOR gate 602), the AND gate 608 blocks the clock signal 106 from reaching the flip flop 202 and the clock signal to the flip flop 202 (206) remains low. Alternatively, if the data signal 102 toggles (e.g., is different than the output signal 108), the clock signal 106 is inverted (e.g., by the NOR gate 604) and passed to the AND gate 608. If the NOR gate output (604) goes high, the clock signal at the AND gate (106) is allowed to pass through to the flip flop 202.

In an implementation, the AND gate 608 can be changed to a NAND gate to replace the first clock inverter stage of the flip flop 202 to save additional power. Also, the gates 604, 606 and 608 remain off when the clock signal 106 is low, thereby reducing power consumption further.

Power Smart Flip Flop Application During Synthesis

Figure 7:
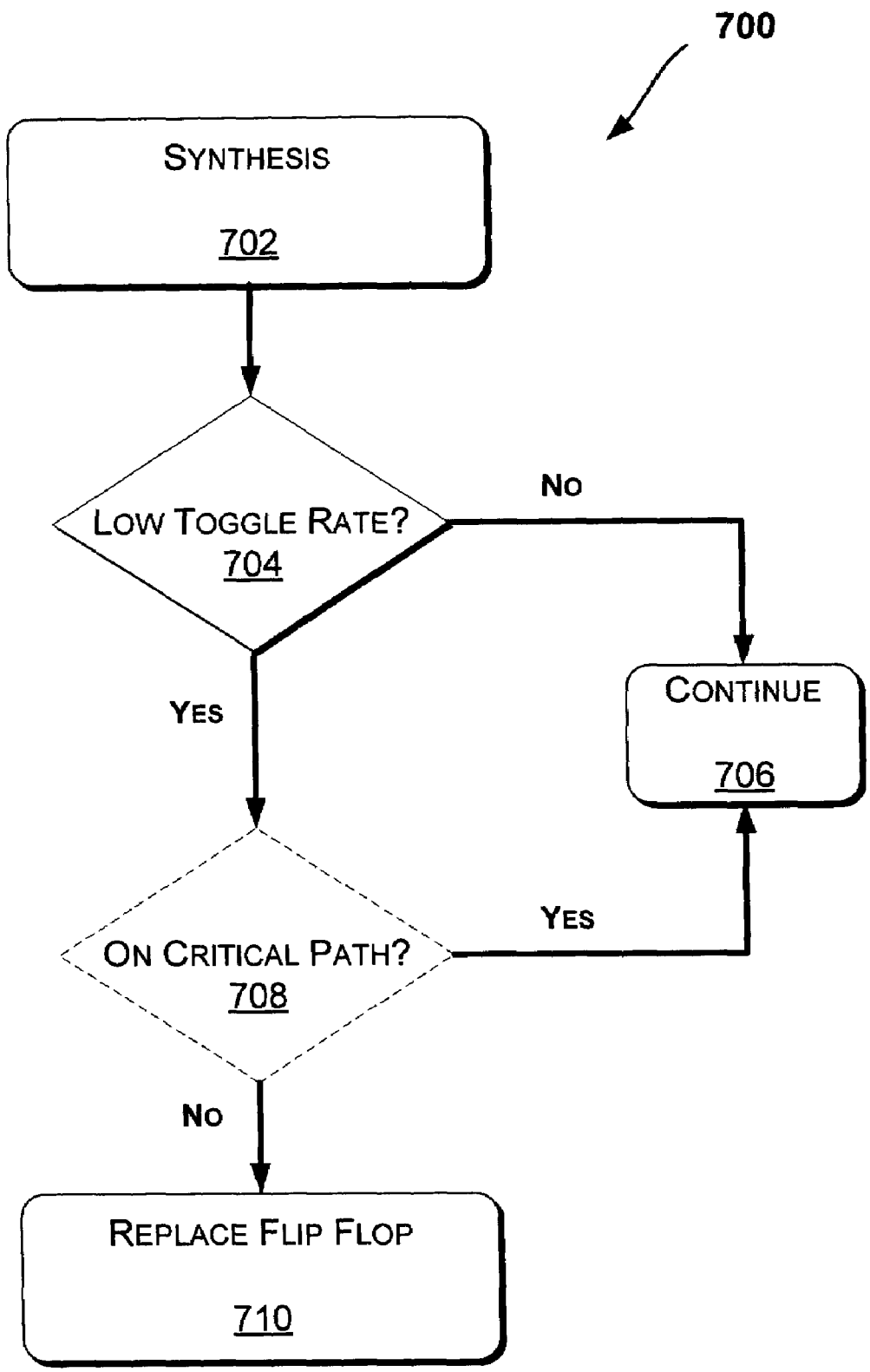
FIG. 7 illustrates an exemplary method of replacing flip flops during synthesis, according to an implementation.

FIG. 7 illustrates an exemplary method 700 of replacing flip flops during synthesis, according to an implementation. After synthesis is initiated (702), it is determined whether a selected flip flop has a low toggle rate (704). As discussed with reference to FIG. 5, the threshold toggle rate may be different depending on a variety of circumstances, applications, designs, etc.

An IC design process generally includes a design phase. During the design phase, hardware engineers design and develop a logical representation of an IC from a set of specifications in the form of a software model represented in a hardware description language (HDL). The HDL model is then loaded into a computer from which a circuit netlist is generated. The translation of HDL code into an equivalent netlist of digital cells is generically referred to as "synthesis." The netlist defines the entire IC design including all components and interconnections which may be utilized to manufacture the actual IC.

If the selected flip flop does not meet the threshold toggle rate (i.e., has a relatively high toggle rate), the method 700 continues with the synthesis process (706). Contrarily, if the toggle rate is relatively low (704), it is optionally determined whether the selected flip flop is on a critical path of the IC (708). If the selected flip flop is on the critical path (708), the method 700 continues with the synthesis process (706). Otherwise, if the selected flip flop is not on the critical path (708) (or directly after the stage 704), the selected flip flop is replaced (710) by a power smart flip flop such as those discussed with reference to FIGS. 1, 2, and 6.

It is also envisioned that even if the selected flip flop is on the critical path (708), the selected flip flop may still be replaced by a power smart flip flop if appropriate setup time margins are observed, cell swapping is performed on the data side of the critical path, relatively stronger driver(s) are utilized, and/or the routing is improved.

Moreover, some implementations (such as that discussed with reference to FIG. 7) may be provided as computer program products, which may include a machine-readable or computer-readable medium having stored thereon instructions used to program a computer (or other electronic devices) to perform a process discussed herein. The machine-readable medium may include, but is not limited to, floppy diskettes, hard disk, optical disks, compact disk read-only memories (CD-ROMs), and magneto-optical disks, ROMs, random-access memories (RAMs), erasable programmable ROMs (EPROMs), electrically EPROMs (EEPROMs), magnetic or optical cards, flash memory, or other types of media or machine-readable media suitable for storing electronic instructions and/or data. Moreover, data discussed herein may be stored in a single database, multiple databases, or otherwise in select forms (such as in a table).

Additionally, some implementations discussed herein may be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection). Accordingly, herein, a carrier wave shall be regarded as comprising a machine-readable medium.

Reference in the specification to "one implementation" or "an implementation" means that a particular feature, structure, or characteristic described in connection with the implementation is included in at least an implementation. The appearances of the phrase "in one implementation" in various places in the specification are not necessarily all referring to the same implementation.

Thus, although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A method comprising:
   determining when a data input of a flip flop remains untoggled;
   turning off, by a clock-gating logic, a clock signal to at least a portion of the flip flop if it is determined that the data input remains untoggled, wherein both the flip flop and the clock-gating logic are to directly receive the data input;
   determining whether the clock signal is on to the portion of the flip flop if it is determined that the data input is toggled; and
   turning on the clock signal to the portion of the flip flop if it is determined that the data input is toggled and the clock signal is off.

2. The method of claim 1, wherein the determining is performed by comparing the data input to an output of the flip flop.

3. The method of claim 1, wherein the turning off of the clock signal reduces power consumption in the flip flop.

4. The method of claim 1, wherein the turning off of the clock signal reduces heat generation by the flip flop.

5. The method of claim 1, wherein the flip flop is selected from a group comprising an RS, a JK, a D, and a latch flip flop.

6. An apparatus comprising:
   a flip flop; and
   a clock-gating logic coupled to the flip flop to turn off a clock signal to the flip flop when a data input of the flip flop remains untoggled, wherein both the flip flop and the clock-gating logic are to directly receive the data input; and
   wherein the clock-gating logic determines whether the clock signal to the flip flop is on if it is determined that the data input is toggled, and turns on the clock signal to the flip flop if it is determined that the data input is toggled and the clock signal is off.

7. The apparatus of claim 6, wherein the clock-gating logic compares the data input with an output of the flip flop to determine when the data input remains untoggled.

8. The apparatus of claim 6, wherein the clock-gating logic comprises an exclusive NOR gate to compare the data input with an output of the flip flop to determine when the data input remains untoggled.

9. The apparatus of claim 6, wherein the clock-gating logic comprises:
   an exclusive NOR gate coupled to receive the data input and an output of the flip flop;
   a NOR gate coupled to receive an output of the exclusive NOR gate and the clock signal; and
   an AND gate coupled to receive the clock signal and an output of the NOR gate.

10. The apparatus of claim 9, wherein an output of the AND gate is coupled to a clock input of the flip flop.

11. The apparatus of claim 9, further comprising a buffer coupled between the NOR and AND gates.

12. The apparatus of claim 11, wherein the buffer is a delay buffer.

13. The apparatus of claim 6, wherein the clock-gating logic and the flip flop are integrated into a single flip flop.

14. The apparatus of claim 6, wherein the flip flop is selected from a group comprising an RS, a JK, a D, and a latch flip flop.

15. An apparatus comprising:
   means for determining when a data input of a flip flop remains untoggled;
   means for turning off a clock signal to at least a portion of the flip flop, wherein both the means for determining and the means for turning off are to directly receive the data input;
   means for determining whether the clock signal is on to the portion of the flip flop if it is determined that the data input is toggled; and
   means for turning on the clock signal to the portion of the flip flop if it is determined that the data input is toggled and the clock signal is off.

* * * * *